US006550091B1

(12) United States Patent
Radman et al.

(10) Patent No.: US 6,550,091 B1
(45) Date of Patent: Apr. 22, 2003

(54) DOUBLE-SIDED WAFER EDGE SCRUBBING APPARATUS AND METHOD FOR USING THE SAME

(75) Inventors: Allan Radman, Aptos, CA (US); Mario Stella, Glasgow (GB)

(73) Assignee: Lam Research Corporation, Fremont, CA (US)

( * ) Notice: Subject to any disclaimer, the term of this patent is extended or adjusted under 35 U.S.C. 154(b) by 188 days.

(21) Appl. No.: 09/680,166

(22) Filed: Oct. 4, 2000

(51) Int. Cl.[7] ................................................ B08B 1/02
(52) U.S. Cl. ............................ 15/77; 15/88.1; 15/88.2; 15/88.3; 15/102; 15/230; 15/230.18
(58) Field of Search ........................ 15/77, 88.1, 88.2, 15/88.3, 102, 230.18, 97.1, 230, 230.11

(56) References Cited

U.S. PATENT DOCUMENTS

| | | | | |
|---|---|---|---|---|
| 1,506,696 A | * | 8/1924 | Walser | 15/230 X |
| 2,238,996 A | * | 4/1941 | Fisher | 15/230 X |
| 3,711,887 A | * | 1/1973 | Chapman | 15/230.11 |
| 4,316,301 A | * | 2/1982 | Smith et al. | 15/230.11 |
| 5,144,711 A | * | 9/1992 | Gill, Jr. | 15/97.1 |
| 5,311,634 A | * | 5/1994 | Andros | 15/97.1 |
| 5,725,414 A | * | 3/1998 | Moinpour et al. | 15/77 X |
| 5,729,856 A | * | 3/1998 | Jang et al. | 15/88.1 |
| 5,861,066 A | * | 1/1999 | Moinpour et al. | 15/97.1 X |

FOREIGN PATENT DOCUMENTS

| | | | | |
|---|---|---|---|---|
| DE | 948130 | * | 8/1956 | 15/230.11 |
| DE | 1105771 | * | 4/1961 | 15/230.11 |

* cited by examiner

Primary Examiner—Mark Spisich
(74) Attorney, Agent, or Firm—Martine & Penilla, LLP

(57) ABSTRACT

A substrate cleaning system incorporating an edge scrubbing roller is disclosed. The system includes a cleaning station having a first brush and a second brush. The second brush is oriented relative to the first brush so as to receive a flat circular substrate therebetween. The first brush and the second brush are configured to simultaneously scrub a first and second surface of the flat circular substrate. The cleaning station also includes a scrubbing roller that is configured to receive an edge of the flat circular substrate. The scrubbing roller has a scrubbing pad for scrubbing a first surface edge of the first surface, a second surface edge of the second surface, and an edge that is not part of either the first or second surface. The edge scrubbing provided by the scrubbing roller advantageously assists in removing edge beading, metal debris, and other particulates that form during fabrication operations, such as metal deposition. In one example, a spray nozzle or multiple nozzles can be directed at the scrubbing roller so as to deliver targeted cleaning fluids that further assist in removing the desired materials from the wafer periphery, whether it be on the top surface edge, the actual edge, or the bottom surface edge.

17 Claims, 8 Drawing Sheets

DOUBLE-SIDED WAFER EDGE SCRUBBING APPARATUS AND METHOD FOR USING THE SAME

BACKGROUND OF THE INVENTION

1. Field of the Invention

The present invention relates to semiconductor wafer cleaning and, more particularly, to apparatuses and methods for cleaning wafer edges before, during and after fabrication operations.

2. Description of the Related Art

In the semiconductor chip fabrication process, it is well-known that there is a need to clean a wafer where a fabrication operation has been performed that leaves unwanted residuals on the surface of the wafer. Examples of such a fabrication operation include plasma etching, material depositions and chemical mechanical planarization (CMP). CMP is commonly performed on both dielectric materials and conductive materials, e.g., such as oxide and copper. If particles or films are left on the surface of the wafer for subsequent fabrication operations, the unwanted residual particles or material may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residue on the surface of the wafer.

FIG. 1A shows a high level schematic diagram of a wafer cleaning system 50. The cleaning system 50 typically includes a load station 10 where a plurality of wafers in a cassette 14 may be inserted for cleaning through the system. Once the wafers are inserted into the load station 10, a wafer 12 may be taken from the cassette 14 and moved into a brush box one 16a, where the wafer 12 is scrubbed with selected chemicals and water (e.g., de-ionized (DI) water). The wafer 12 is then moved to a brush box two 16b. After the wafer has been scrubbed in the brush boxes 16, the wafer is moved into a spin, rinse, and dry (SRD) station 20 where DI water is sprayed onto the surface of the wafer and spun to dry. During the rinsing operation in the SRD station. After the wafer has been placed through the SRD station 20, the wafer is moved to an unload station 22.

FIG. 1B shows a simplified view of a cleaning process performed in brush box one 16a. In brush box one 16a, the wafer 12 having a top surface 12a (i.e., the active side) is inserted between a top brush 30a and a bottom brush 30b. The wafer 12 is capable of being rotated by holding and driving rollers (not shown) and the rotating brushes 30a and 30b to adequately clean the entire top and bottom surfaces of the wafer. After typical CMP operations, a wafer is placed into the cleaning station 50. In brush box one 16a, the top brush 30a and the bottom brush 30b are preferably concentrated with a cleaning chemical, which is received from a source 32 or other sources controlled by a chemical/DI water dispensing system (not shown).

A common fabrication operation includes the deposition of metals over previously formed dielectric features, which is commonly done in damascene and dual-damascene processes. As is generally defined, damascene and dual-damascene processes include the formation of features, such as interconnect lines and vias into dielectric materials, filling the dielectric features with conductive material, e.g., such as copper, and then performing CMP operations to remove the excess metallization material. The metal material can be formed over the wafer using various techniques, such as, for example, deposition, electroplating, sputtering, and the like.

In either case, the formation of metal material may form excess beading around the periphery of the wafer. It is also a common operation to perform standard cleaning operations after such metal deposition operations, to ensure that the excess metal and lose particles and contaminants are removed from the wafer before engaging in further processing.

A problem typically experienced is that standard brush scrubbing and edge cleaning techniques fail to clean and remove the metal edge beading and loose particles from wafer edge surfaces sufficiently well. One approach to edge cleaning was described in U.S. Pat. No. 5,861,066, entitled "Method and Apparatus for Cleaning Edges of Contaminated Substrate." This U.S. Patent is incorporated herein by reference. Although this apparatus does well at cleaning the immediate edge of the wafer, other portions of the wafer edge in which beading and particulates adhere are most commonly not sufficiently addressed. That is, although sufficient center cleaning is performed using the brushes 30 of FIG. 1B, not enough mechanical scrubbing is performed directly on the top and bottom surface areas near the edge. Consequently, edge beading particle collection will remain even after repeated conventional brush cleaning.

In view of the foregoing, there is a need for an apparatus and method for enhancing wafer edge cleaning, especially in cases of post metal deposition operations.

SUMMARY OF THE INVENTION

Broadly speaking, the present invention fills these needs by providing an improved method for cleaning semiconductor wafer edge regions. It should be appreciated that the present invention can be implemented in numerous ways, including as a process, an apparatus, a system, a device or a method. Several inventive embodiments of the present invention are described below.

In one embodiment, a substrate cleaning system is disclosed. The system includes a cleaning station having a first brush and a second brush. The second brush is oriented relative to the first brush so as to receive a flat circular substrate therebetween. The first brush and the second brush are configured to simultaneously scrub a first and second surface of the flat circular substrate. The cleaning station also includes a scrubbing roller that is configured to receive an edge of the flat circular substrate. The scrubbing roller has a scrubbing pad for scrubbing a first surface edge of the first surface, a second surface edge of the second surface, and an edge that is not part of either the first or second surface.

In another embodiment, a substrate cleaning system is disclosed. The system includes a cleaning station having a first brush and a second brush. The second brush is oriented relative to the first brush so as to receive a flat circular substrate therebetween. The first brush and the second brush are configured to simultaneously scrub a first and second surface of the flat circular substrate. The cleaning station also includes a scrubbing clamp. The scrubbing clamp is configured to receive an edge of the flat circular substrate. The scrubbing clamp has a scrubbing pad for scrubbing a first surface edge of the first surface, a second surface edge of the second surface, and an edge that is not part of either the first or second surface.

In yet another embodiment, a scrubbing roller is disclosed. The roller includes a top roller core and a bottom roller core. The top roller core and the bottom roller core define a U-shaped circular pocket. The roller further includes a scrubbing pad that is configured to line the U-shaped circular pocket. The scrubbing pad is configured to receive an edge region of a semiconductor wafer. The edge region is configured to be inserted into the U-shaped circular pocket so as to scrub a top surface region, an edge surface region and a bottom surface region of the edge region of the semiconductor wafer.

The advantages of the present invention are numerous. Most notably, the wafer edge scrub roller and clamp each are configured to locally scrub the top surface, the edge surface, and the bottom surface of the wafer along the periphery. This localized scrubbing assists in removing post metal deposition beading, removal of metal debris, loosely held metallic deposition films, and particulates. The edge scrubbing is preferably assisted by the implementation of one or more nozzles that direct cleaning fluids, such as, DI water and other know cleaning fluids directly at the edge/pad material being used for scrubbing. This localized and concentrated mechanical/chemical scrubbing of the wafer edge thus assists in providing cleaner wafers throughout the entire surface (e.g., along the edge and non-edge regions), thus improving yield for wafer cleaner end users.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

Embodiments for methods and apparatus for cleaning wafer edge regions are disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

Figure 2A:
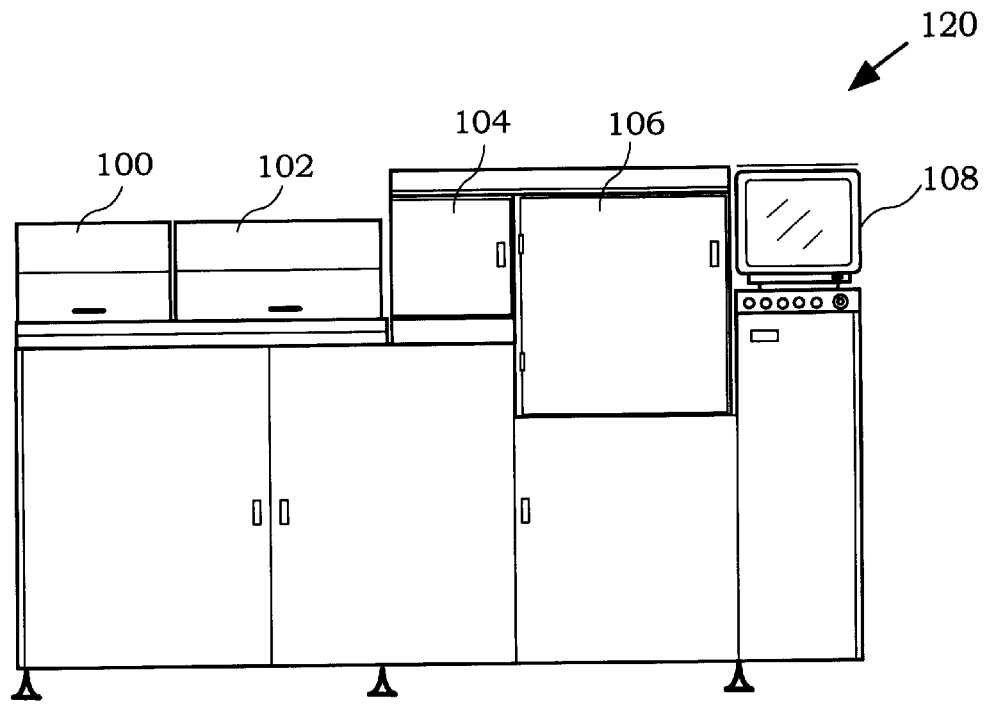
FIG. 2A shows a side view of a wafer cleaning system, in accordance with one embodiment of the present invention.
Figure 2B:
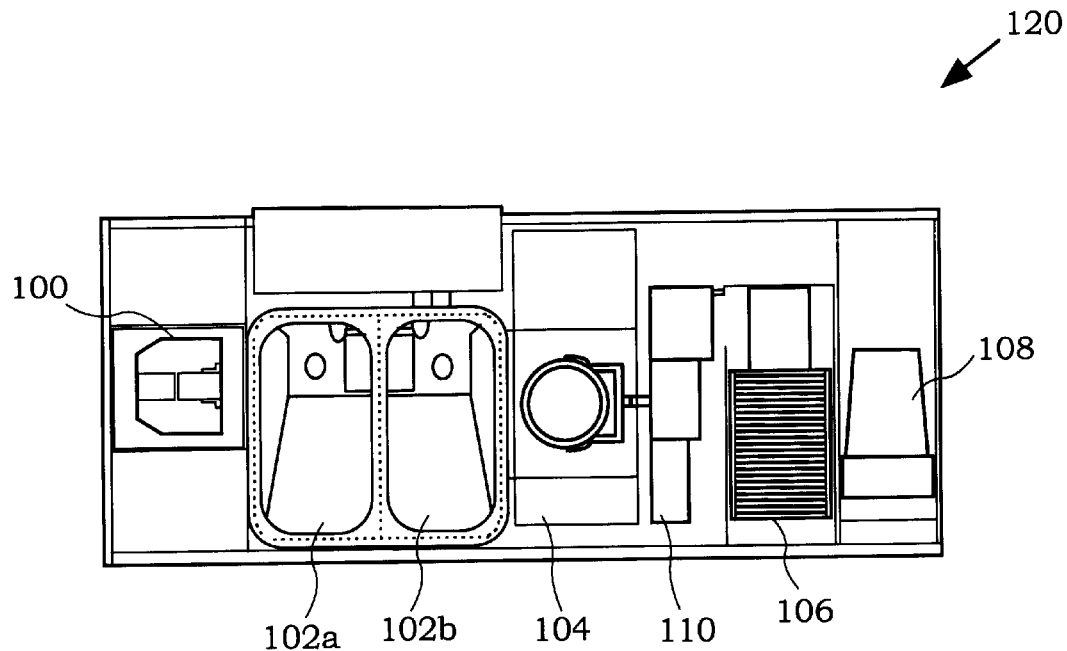
FIG. 2B shows a top view of the cleaning system of FIG. 2A, in accordance with one embodiment of the present invention.

FIGS. 2A and 2B show a side view and a top view, respectively, of a cleaning system 120. The cleaning system 120 typically includes an input station 100 where a plurality of wafers may be inserted for cleaning through the system. Once the wafers are inserted into the input station 100, a wafer may be taken from the input station 100 and moved into a brush box one 102a, where the wafer is scrubbed with selected chemicals and water (e.g., de-ionized water) before being moved to a brush box two 102b. As will be described below, each of the brush boxes 102 can include an edge brushing apparatus, such as a scrubbing roller. The edge brushing apparatus is configured to apply mechanical scrubbing to an edge region of the wafer as well as surface regions along the periphery of the wafer. The edge brush apparatus can be configured to apply different amounts of pressure and can be configured with accompanying spray nozzles, misters or fluid applicators to further assist in the scrubbing.

After the wafer has been scrubbed in the brush boxes 102, the wafer is moved into a spin, rinse, and dry (SRD) station 104, where de-ionized (DI) water is sprayed onto the surface of the wafer and spun to dry. After the wafer has been placed through the SRD station 104, an unload handler 110 takes the wafer and moves it into an output station 106. The cleaning system 120 is configured to be programmed and controlled from system electronics 108.

Figure 1A:
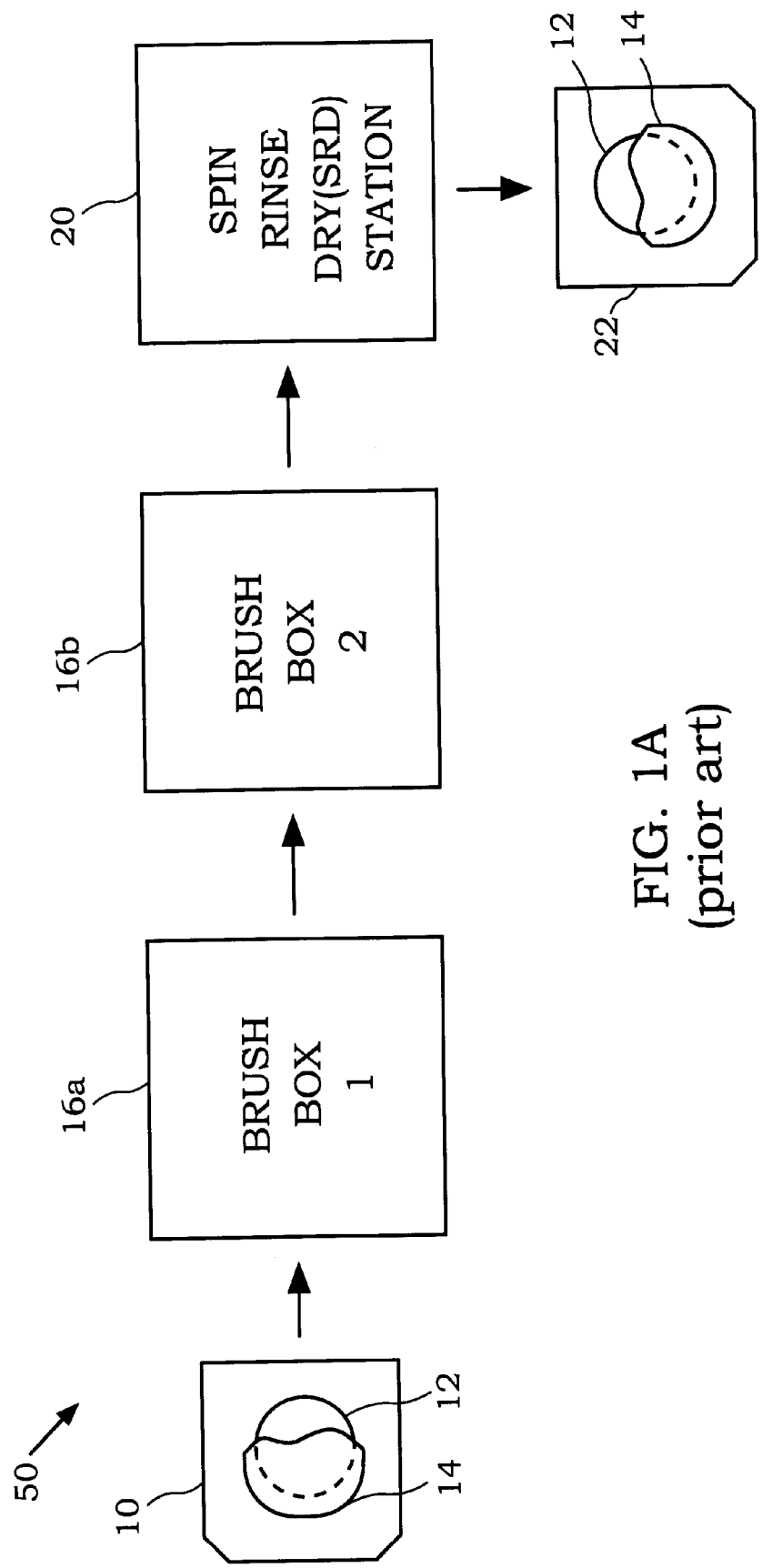
FIG. 1A shows a high level schematic diagram of a wafer cleaning system.
Figure 1B:
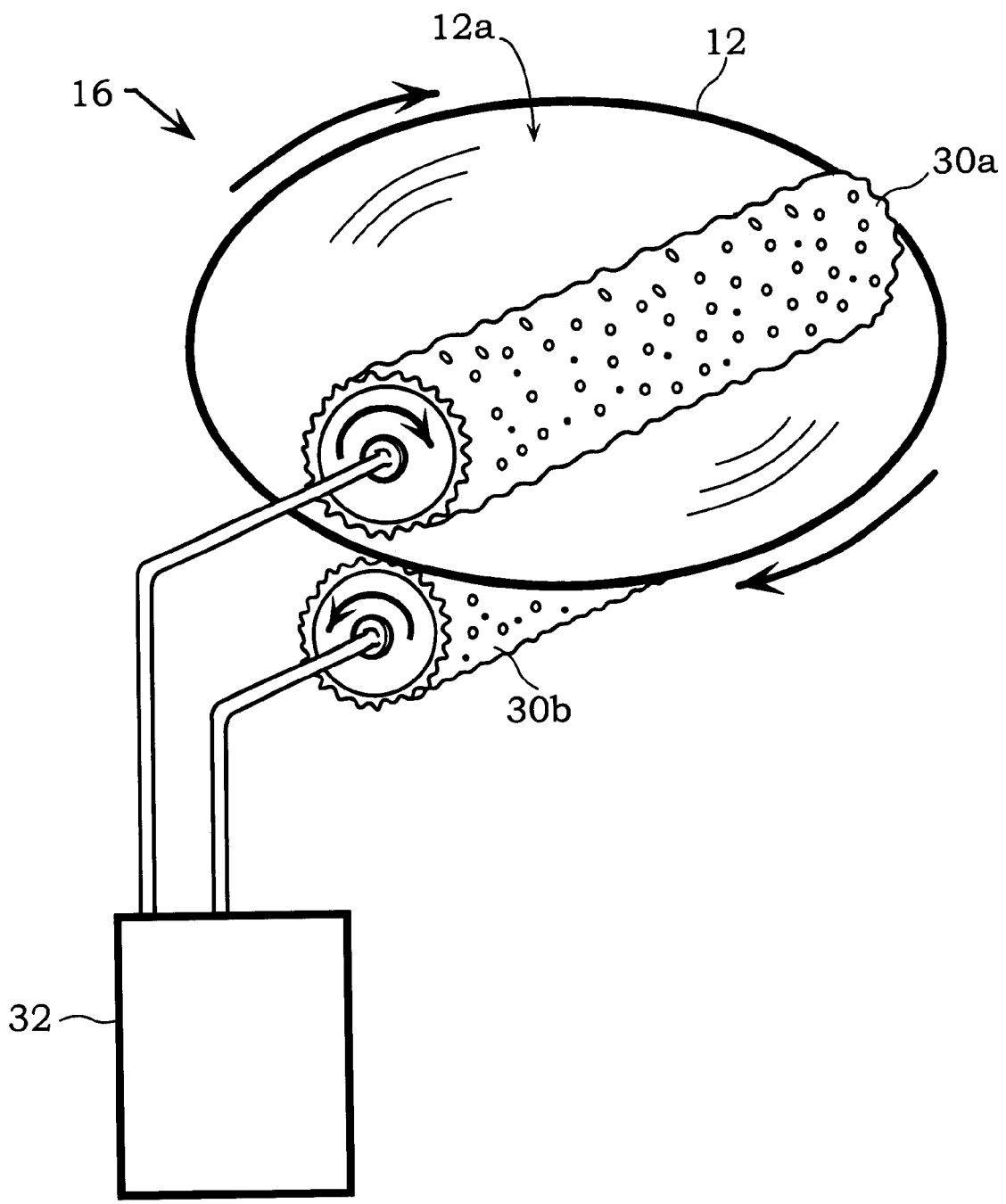
FIG. 1B shows a detailed view of a wafer cleaning process performed in a brush. box.
Figure 3A:
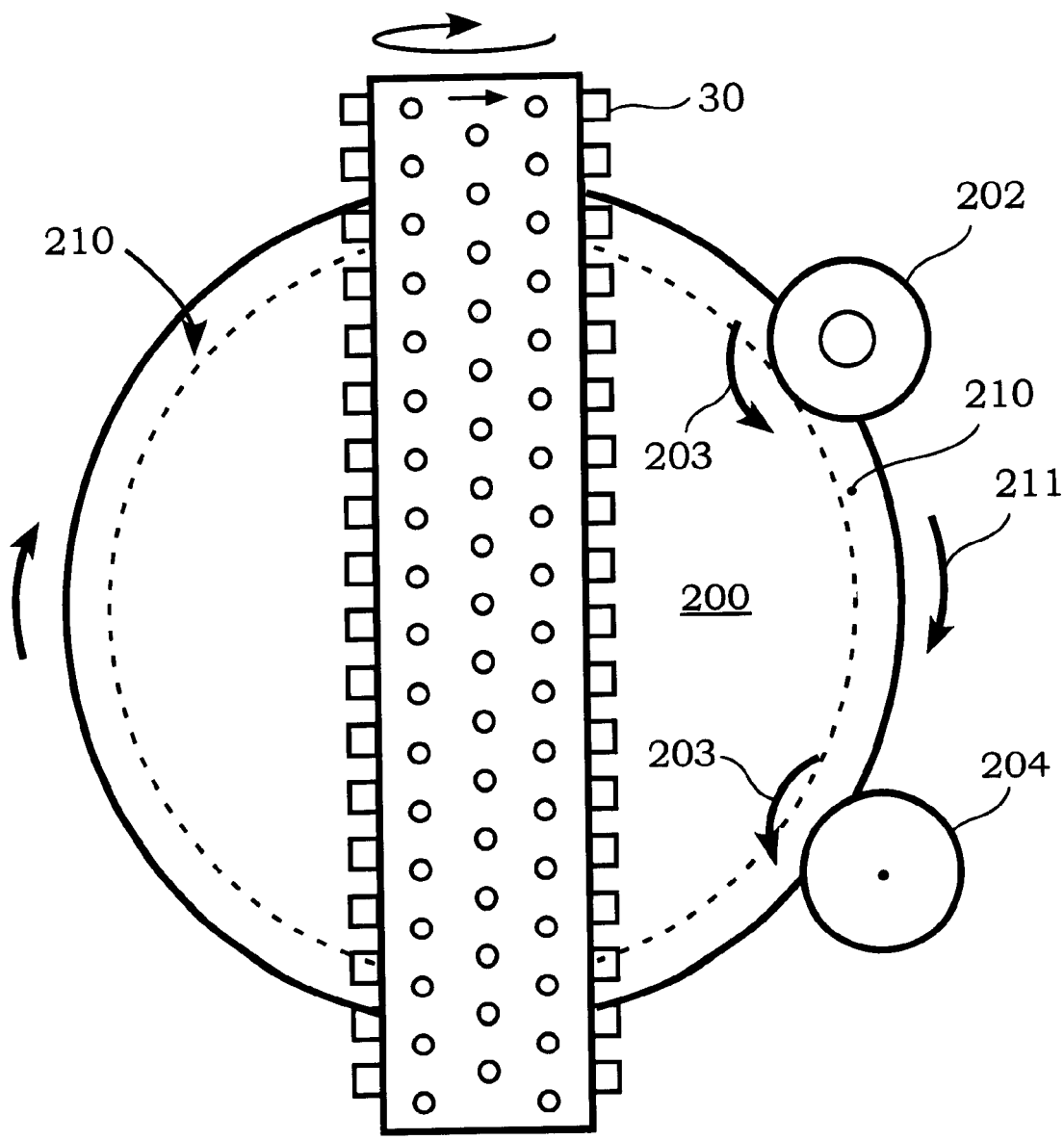
FIG. 3A shows a top view of a wafer cleaning apparatus having an edge scrub roller and a drive roller, in accordance with one embodiment of the present invention.

FIGS. 3A shows a more detailed view of a cleaning apparatus inside one of the brush boxes 102. A load handler may take the wafer 200 from the input station 100 and position the wafer inside the brush box 102a. A top cleaning brush 30a and a bottom cleaning brush 30b, are positioned on respective surfaces of the wafer surface 200 (as shown in FIG. 1B). A cleaning brush 30 typically has a plurality of small surface mounds distributed in evenly spaced rows along the surface of a cleaning brush 30. The brushes 30 can be made from polyvinyl alcohol (PVA), mohair, and other wrapped materials that are soft enough to prevent damage to circuit devices. The brushes 30 can also function as a conduit for fluids that are to be applied to the wafer surface.

For more information on wafer cleaning systems and techniques, reference may be made to commonly owned U.S. patent application having application numbers: (1) Ser. No. 08/792,093, filed Jan. 31, 1997, entitled "Method And Apparatus For Cleaning Of Semiconductor Substrates Using Standard Clean 1 (SC1)," U.S. Pat. No. 5,858,109 and (2) Ser. No. 08/542,531, filed Oct. 13, 1995, entitled "Method and Apparatus for Chemical Delivery Through the Brush", abandoned. Both U.S. patent applications are hereby incorporated by reference.

During the cleaning process, the wafer 200 may be rotated between the cleaning brushes 30 and a set of rollers 202 and 204. In a preferred embodiment, roller 202 is a scrub roller and roller 204 is a drive roller. Although, is should be understood that the rollers 202 and 204 can be interchanged with each other. In other embodiments, it is possible to have two or more scrub rollers 202 in addition to the drive roller 204. Still further, drive roller 204 can also be omitted if at least two scrub rollers 202 are used. The wafer preferably rotates at about 20 rotations per minute or less. This is about ⅕ the rotational speed using in conventional SRD stations.

A chemical cleaning fluid is generally applied to the wafer 200 surfaces through the brush (TTB) as the cleaning brushes 30 scrub the wafer 200 surfaces. It should be appreciated by one of ordinary skill in the art that a chemical cleaning fluid may alternatively be applied by other means, such as an external drip applicator (not shown), as opposed to TTB. Where a chemical cleaning fluid has been applied to the wafer 200 surfaces via a TTB application technique, it is generally desired to clean the wafer 200 surfaces with water (preferably de-ionized "DI" water) after chemical scrubbing. If left on the wafer 200 surface, the chemicals may cause unwanted reactions in subsequent cleaning and post-cleaning operations.

Still referring to FIG. 3A, the scrub roller 202 is implemented to perform a scrubbing operation at an edge of the wafer 200, including surface regions of the wafer near the edge. As is well known, these regions are often referred to as the edge exclusion regions (EER) 210. The EER in 200 mm and 300 mm wafers can extend from between about 1 mm and about 7 mm into the wafer from the peripheral edge. In another embodiment, the EER can extend from between about 2 mm and about 3 mm into the wafer from the peripheral edge. Preferably, the drive roller 204 is configured to assist in driving the wafer 200 in the wafer rotation direction 211. The rotation of the brush 30 also assists in moving the wafer closer into and against the scrub roller 202 and the drive roller 204. In a preferred embodiment, the scrub roller 202 is preferably configured to receive not only the edge of the wafer, but also a portion of both the top and bottom portions of the wafer 200 (e.g., the EER 210). The receiving by the scrub roller 202 is configured to be a tight enough fit (by adjustment or the like) such that the scrubbing material of the scrub roller 202 performs a sufficient degree of mechanical scrubbing against the surface of the wafer. This additional mechanical scrubbing will assist in removing, for example, edge beading, which commonly builds up during standard metal deposition and which is often not removed by simply using the brushes 30. Edge beading is sometimes observed under fine microscopes and includes loosely held metallic particles, debris, and films.

Figure 3B:
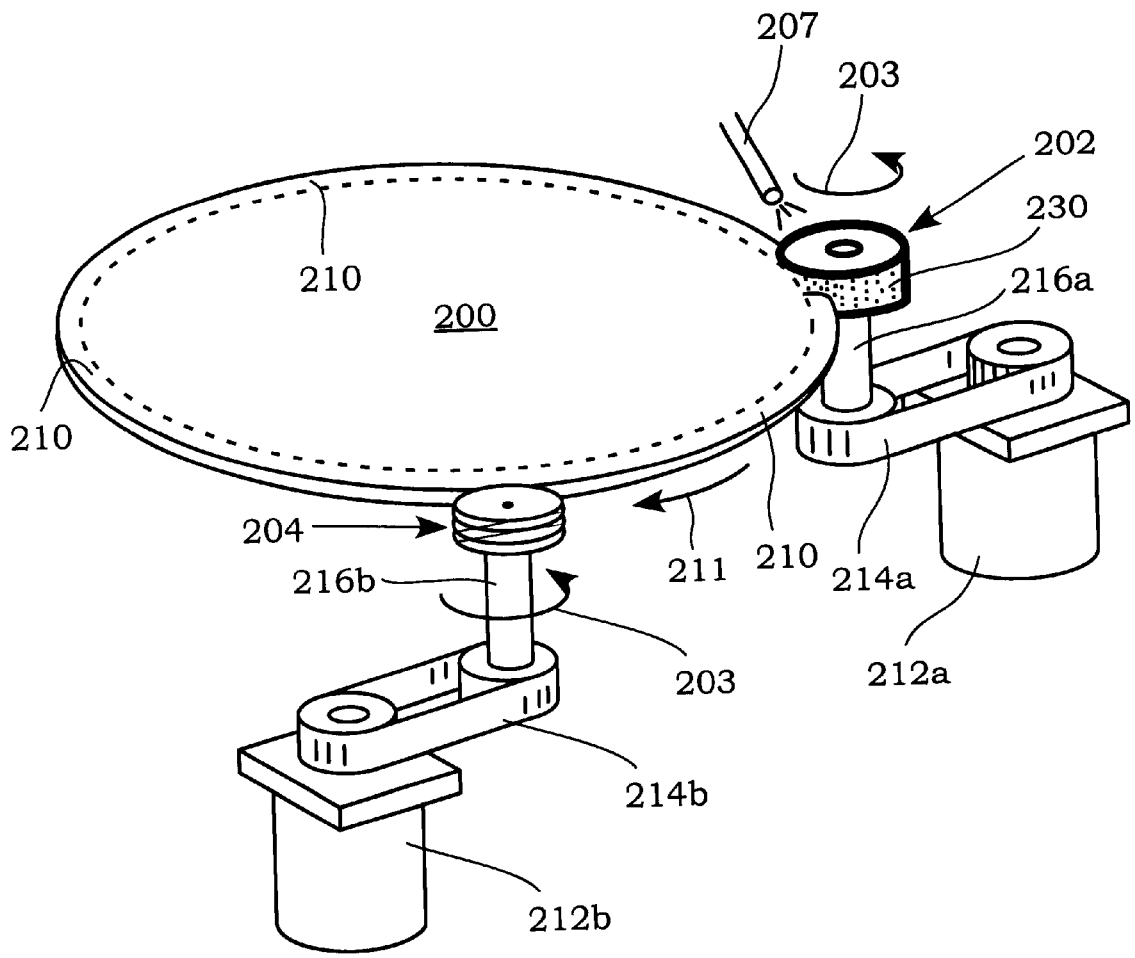
FIG. 3B shows a three dimensional view of a wafer incorporating an edge scrub roller and nozzle, in accordance with one embodiment of the present invention.

FIG. 3B illustrates a three-dimensional diagram of FIG. 3A in which the scrub roller 202 is shown scrubbing the EER 210 of the wafer 200 as a spray nozzle 207 delivers cleaning fluids to the scrub roller 202. Each roller is shown rotating in direction 203. In a preferred embodiment, the spray nozzle 207 is configured to deliver just the right amount of cleaning solution, DI water, or chemicals (e.g., SC1, Ammonia, HF) to the scrub roller 202 and the wafer 200 during the cleaning operation. As shown, the drive roller 204 is also engaged with the wafer 200, however, the wafer 200 is not fully engaged within the drive roller 204 as is the scrub roller 202. The scrub roller 202 is shown having a pad 230 formed within a circular U-shaped pocket defined in the scrub roller 202. The U-shaped pocket having the pad 230 lining thus provides an efficient way of scrubbing both the top, edge and bottom regions of the wafer along the periphery. Pad 230 can be made from polyvinyl alcohol (PVA), mohair, and Suba-IV™, Suba 1000™, IC1000™, IC14000™, Politex™, some of which are available from Rodel, Inc. of Phoenix, Ariz., and other materials that are strong enough to scrub unwanted particles from the wafer edge region yet prevent damage to delicate circuit devices.

The scrub roller 202 is driven by a shaft 216a that is connection to a belt 214a and a motor 212a. The drive roller 204, in a like manner, is connected to a shaft 216b which is driven by a belt 214b and the motor 212b. In this illustration, both the scrub roller 202 and the drive roller 204 can be configured to rotate at different tangential velocities in direction 203 so as to promote a scrubbing operation that removes the desired materials, particulates, or edge beads commonly associated with metal deposition. Although not shown in FIG. 3B, the wafer 200 is also preferably scrubbed with brushes 30 at the same time the scrubbing of the edge and EER 210 of the wafer are scrubbed.

Figure 4:
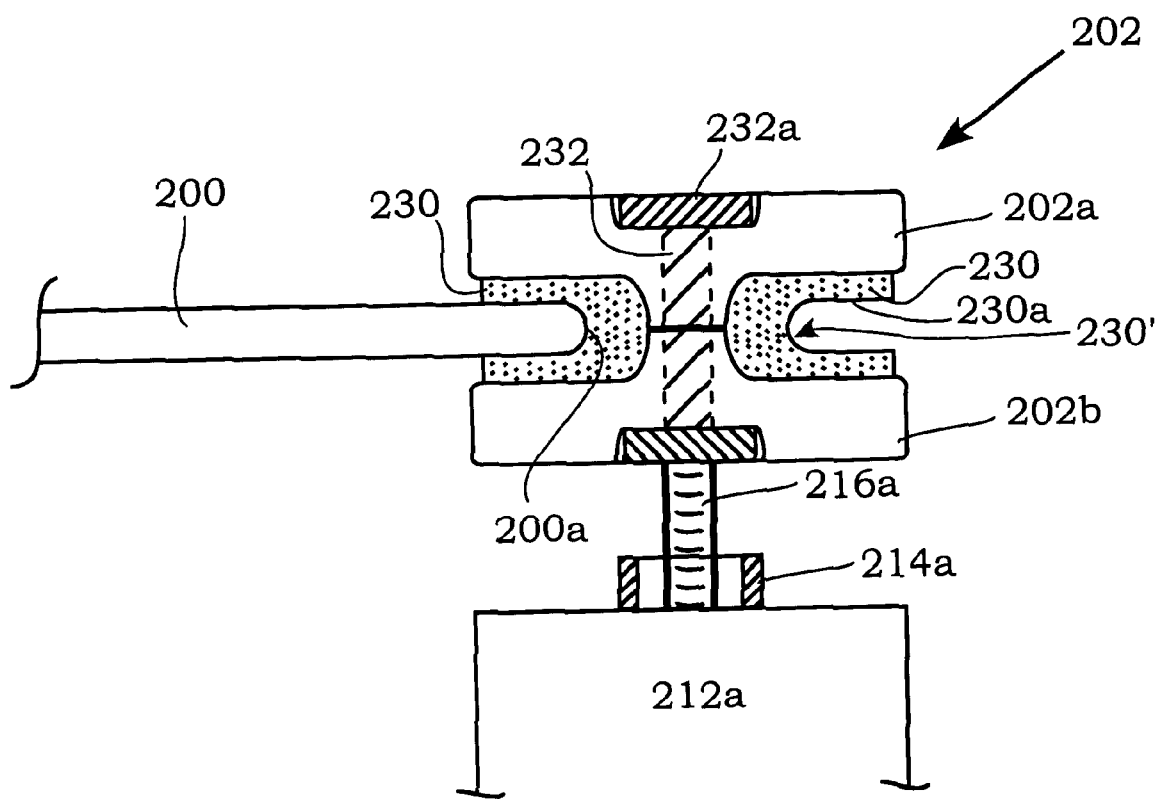
FIG. 4 illustrates a cross sectional view of a scrub roller receiving an edge region of a wafer, in accordance with one embodiment of the present invention.

FIG. 4 illustrates a cross sectional view of the scrub roller 202 receiving an edge region of the wafer 200. The scrub roller 202 includes a top roller core 202a and a lower roller core 202b which are clamped together by way of a clamping adjuster 232a and a screw 232. Preferably, the top roller core 202a and lower roller core 202b are made of Teflon™ (or other chemically inert material). The scrub pad 230 is formed or inserted within a pocket formed by the top roller core 202a and the lower roller core 202b. The scrub pad 230 can be taped on, glued on or attached in any manner that does not introduce contaminants or particulates during scrubbing. Preferably, the scrub pad 230 will have a thicker inner region near the center of the scrub roller 202 such that mechanical wear of the scrub pad 230 will provide a sufficient life span for the scrub roller 202 before the pad 230 will require replacement.

As shown, the edge 200a of the wafer 200 is placed up against the edge surface scrub pad 230' which serves to scrub the actual edge 200a of the wafer 200 while the edge exclusion region scrub pad 230a serve to scrub the top surface and the bottom surface respectively of the wafer in the edge exclusion region (EER) 210. As shown, the shaft 216a is connected to the lower roller core 202b and the shaft 216a is connected to the belt 214a that then connects to the motor 212a. The motor 212a can be adjusted to deliver the proper amount of torque and power to cause the roller to rotate at the desired speed to achieve a given cleaning operation. It should be noted that some cleaning operations require more vigorous scrubbing while others require slightly more gentle scrubbing to remove different types of materials and particulates.

For instance, the type of scrubbing performed after metal deposition operations which leave edge bead buildup require more vigorous scrubbing operations which then can be controlled by the rate at which the roller 202 rotates with respect to the drive roller 204. In another embodiment, the scrub pad 230 can be adjusted in thickness so as to provide a tighter fit for the wafer 200 and thus, perform more vigorous scrubbing in the edge exclusion region 210.

Figure 5:
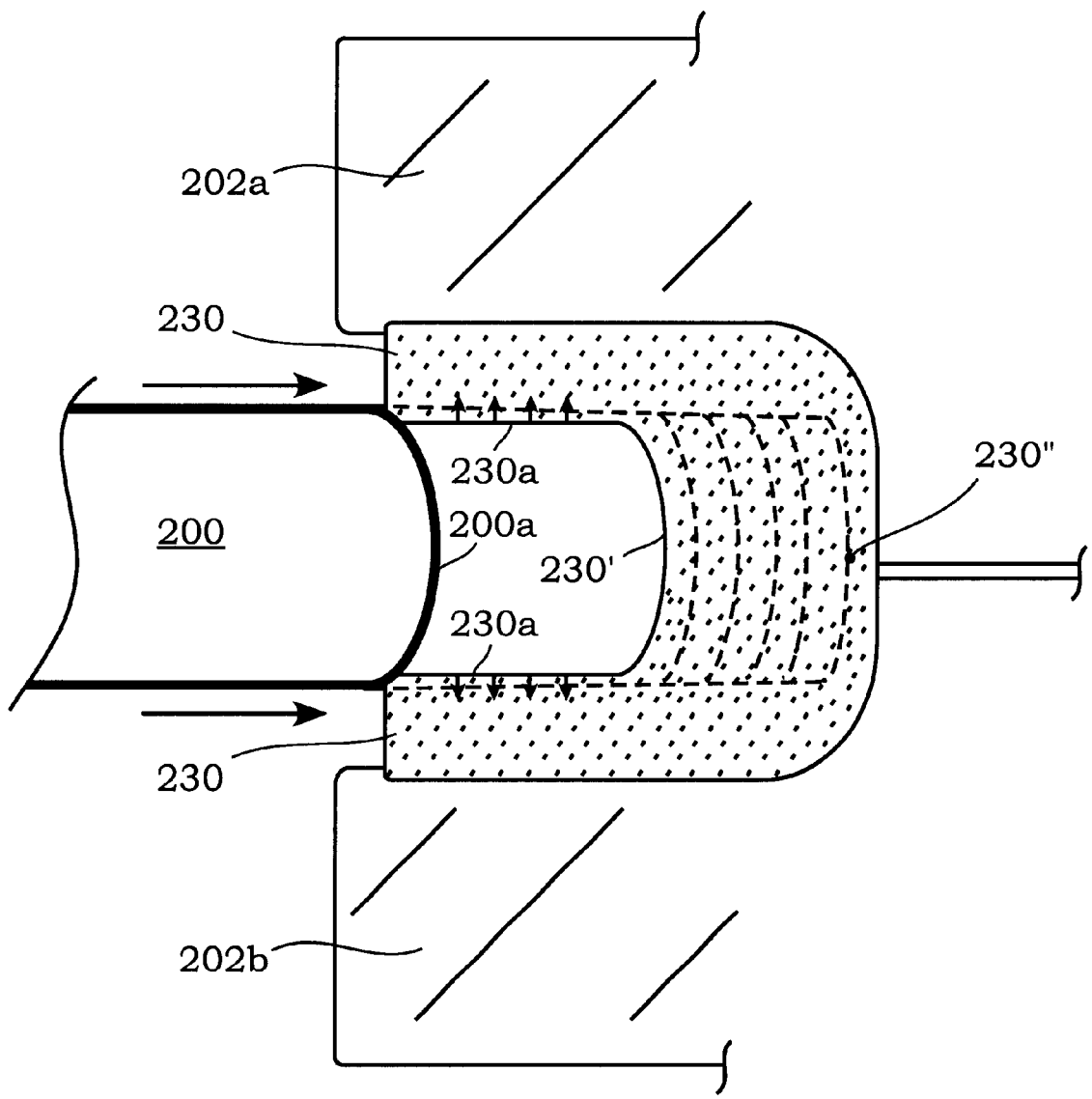
FIG. 5 shows a more detailed diagram of FIG. 4 in which the wafer is inserted into the pad, in accordance with one embodiment of the present invention.

FIG. 5 shows a more detailed diagram of FIG. 4 in which the wafer 200 is inserted into the pad 230, in accordance with one embodiment of the present invention. As shown, the pad 230 is designed to provide a tight fit for the wafer 200 so that as the wafer 200 enters the pocket formed by the pad 230, the pad 230 will enlarge (pushed in) and thus, provide the desired amount of scrubbing over the surface regions of the wafer 200 and the edge regions 200a. As shown, the pad 230 will compress at the edge exclusion region scrub pad portions 230a and over time, will wear at the edge surface scrub pad region 230'. As the pad 230 wears, the wafer 200 will progress from the edge surface scrub pad region 230' out to the pad endpoint 230".

In another embodiment, the top roller core 202a and the lower roller core 202b can be made to be adjustable and provide additional force upon the top and bottom portions of the wafer by way of the pad regions 230a. In either case, as the pad 230 wears, a point will come where the pad 230 may have to be replaced to ensure that proper scrubbing is maintained for the particular process.

Figure 6A:
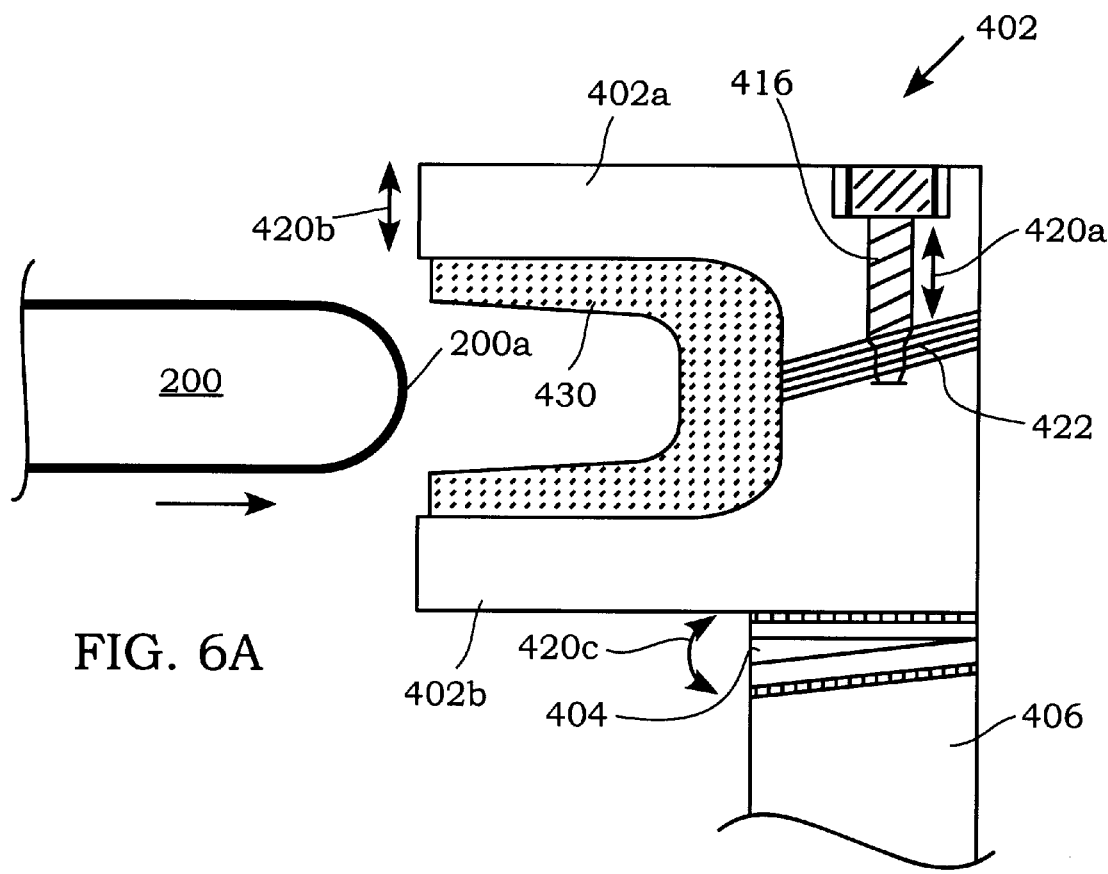
FIGS. 6A and 6B illustrate cross-sectional views of an alternative embodiment of the present invention, in which a clamp scrubber is implemented in place of a roller.

FIG. 6A illustrates a cross-sectional view of an alternative embodiment of the present invention. The alternative embodiment includes a scrub clamp 402 that can be brought up against the edge of the wafer 200 while the wafer is being scrubbed by rollers in one of the scrub brush boxes as described above. The scrub clamp 402 includes a clamp top 402a and a clamp bottom 402b which is adjustable by way of an adjustment screw 416 which allows size adjustment movements 420a against an adjustable joint 422.

The scrub clamp 402 is also configured to be connected to a shaft 406 by way of an adjustable neck 404. The adjustable neck 404 will allow angular movement 420c of the scrub clamp 402 so as to achieve the desired scrubbing on either the top portion of the wafer surface or the bottom portion of the wafer surface as may be needed. Although the adjustments to the scrub clamp 402 are shown by way of screw adjustments, other types of adjustment techniques may be used so long as the desired adjustment is made to the scrub clamp 402 to provide the desired scrubbing level over the wafer 200, and in particular, at the edge exclusion region

Figure 6B:
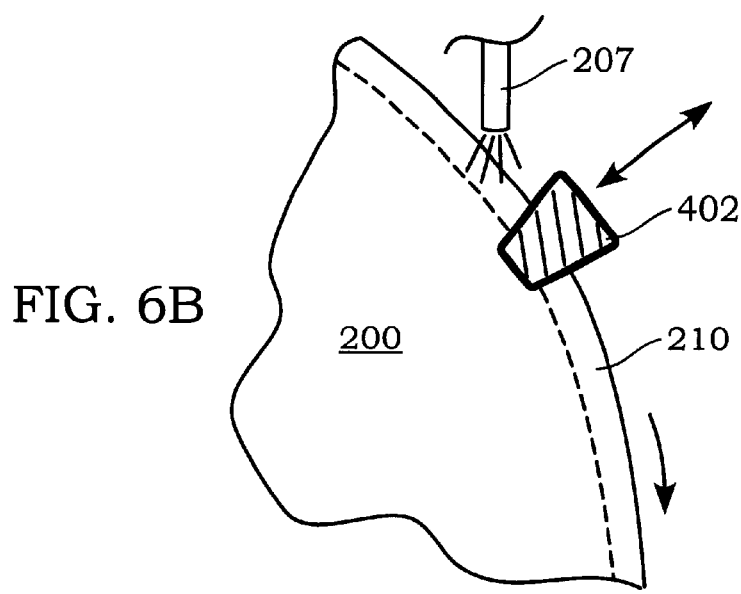

210. As shown, the scrub clamp 402 also includes a scrub pad 430 which is configured to receive the wafer 200 as shown in FIG. 6B. Pad 430 is preferably the same as pad 230 described above. As the wafer rotates, the scrub clamp 402 will place a sufficient amount of pressure at the edge exclusion region such that the top surface and bottom surface in the edge exclusion region 210 of the wafer 200 is scrubbed to a sufficient level.

To ensure that the proper amount of edge exclusion region scrubbing is being performed, a nozzle 207 can also be provided in close proximity to the scrub clamp 402 such that the appropriate fluids that will facilitate the scrubbing can be delivered at the point of scrubbing by the scrub clamp 402. As mentioned above, the fluids can include DI water, chemicals, hydrofluoric acid, and other chemicals that are well known in the art.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A substrate cleaning system, comprising:
   a cleaning station, the cleaning station including,
     a first brush;
     a second brush, the second brush being oriented relative to the first brush so as to receive a flat circular substrate therebetween, the first brush and the second brush being configured to simultaneously scrub a first and second surface of the flat circular substrate;
     a scrubbing roller, the scrubbing roller being configured to receive an edge of the flat circular substrate, the scrubbing roller having a scrubbing pad for scrubbing a first surface edge of the first surface, a second surface edge of the second surface, and an edge that is not part of either the first or second surface, and the scrubbing roller has a top roller core and a lower roller core, the top roller core and the lower roller core being adjustable so as to apply a force on the first surface and the second surface of the flat circular substrate.

2. A substrate cleaning system as recited in claim 1, wherein the cleaning station further comprising:
   a spray nozzle being directed at the scrubbing pad of the scrubbing roller.

3. A substrate cleaning system as recited in claim 1, wherein the cleaning station further comprising:
   a drive roller, the drive roller being configured to stabilize and rotate the flat circular substrate when placed between the first and second brushes.

4. A substrate cleaning system as recited in claim 1, wherein the scrubbing pad has a U-shape.

5. A substrate cleaning system as recited in claim 4, wherein the pad is made from one of PVA material, a mohair material, and a Suba IV material.

6. A substrate cleaning system as recited in claim 4, wherein the U-shape has a first surface scrub region, and edge surface scrub region, and a second surface scrub region, the edge surface region being between the first and second surface scrub regions.

7. A substrate cleaning system as recited in claim 6, wherein the first surface scrub region and the second surface scrub region define an opening separation that is less than a thickness of the flat circular substrate.

8. A substrate cleaning system as recited in claim 1, wherein a screw is used to provide the adjustment of the top roller core and the lower roller core.

9. A substrate cleaning system, comprising:
   a cleaning station, the cleaning station including,
     a first brush;
     a second brush, the second brush being oriented relative to the first brush so as to receive a flat circular substrate therebetween, the first brush and the second brush being configured to simultaneously scrub a first and second surface of the flat circular substrate;
     a scrubbing clamp, the scrubbing clamp being configured to receive an edge of the flat circular substrate, the scrubbing clamp having a scrubbing pad for scrubbing a first surface edge of the first surface, a second surface edge of the second surface, and an edge that is not part of either the first or second surface, wherein the scrubbing clamp has a clamp top and a clamp bottom, the clamp top and the clamp bottom being adjustable so as to apply a force on the first surface and the second surface of the flat circular substrate.

10. A substrate cleaning system as recited in claim 9, wherein the cleaning station further comprising:
    a spray nozzle being directed at the scrubbing pad of the scrubbing clamp.

11. A substrate cleaning system as recited in claim 9, wherein the cleaning station further comprising:
    a drive roller, the drive roller being configured to stabilize and rotate the flat circular substrate when placed between the first and second brushes.

12. A substrate cleaning system as recited in claim 9, wherein the scrubbing pad has a U-shape.

13. A substrate cleaning system as recited in claim 12, wherein the pad is made from one of PVA material, a mohair material, and a Suba IV material.

14. A scrubbing roller for scrubbing peripheral regions of a semiconductor wafer, comprising:
    a top roller core;
    a bottom roller core, the top roller core and the bottom roller core defining a U-shaped circular pocket; and
    a scrubbing pad configured to line the U-shaped circular pocket, the scrubbing pad being configured to receive an edge region of a semiconductor wafer, the edge region configured to be inserted into the U-shaped circular pocket so as to scrub a top surface region, an edge surface region and a bottom surface region of the edge region of the semiconductor wafer, wherein the top roller core and the bottom roller core are adjustable so as to change an opening of the U-shaped circular pocket and apply a force.

15. A scrubbing roller as recited in claim 14, wherein the scrubbing pad is made one of PVA material, a mohair material, and a Suba IV material.

16. A scrubbing roller as recited in claim 14, wherein the edge region is an edge exclusion region ranging between about 1 mm and about 7 mm.

17. A scrubbing roller as recited in claim 14, wherein the top roller and the bottom roller core are made of polytetrafluoroethylene.

* * * * *